US007445970B2

(12) United States Patent
Lai

(10) Patent No.: US 7,445,970 B2
(45) Date of Patent: Nov. 4, 2008

(54) METHOD FOR MANUFACTURING THIN FILM TRANSISTOR

(75) Inventor: Chien-Ting Lai, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 52 days.

(21) Appl. No.: 11/580,610

(22) Filed: Oct. 12, 2006

(65) Prior Publication Data

US 2007/0087495 A1 Apr. 19, 2007

(51) Int. Cl.
*H01L 21/00* (2006.01)

(52) U.S. Cl. ........................ 438/149; 438/151; 438/157; 438/158; 438/197; 257/E21.415; 257/E29.137; 257/E29.147

(58) Field of Classification Search ................. 438/151, 438/157, 158, 149, 197; 257/E21.415, E29.137, 257/E29.147
See application file for complete search history.

(56) References Cited

U.S. PATENT DOCUMENTS

| | | | | |
|---|---|---|---|---|
| 5,015,597 | A | 5/1991 | Vinouze et al. | |
| 5,700,606 | A * | 12/1997 | Kobayashi et al. | 430/5 |
| 7,161,212 | B2 * | 1/2007 | Ohishi et al. | 257/347 |
| 2005/0041169 | A1 * | 2/2005 | Hashimoto et al. | 349/43 |
| 2005/0059190 | A1 * | 3/2005 | Lee et al. | 438/149 |
| 2005/0074682 | A1 * | 4/2005 | Noda et al. | 430/30 |

* cited by examiner

*Primary Examiner*—Andy Huynh
(74) *Attorney, Agent, or Firm*—Wei Te Chung

(57) ABSTRACT

An exemplary photomask (150) has a slit. The slit has at least one turning region (D1) and at least one other regions, and the slit at the at least one turning region has a narrower width than the slit at the at least one other regions. An exemplary method for manufacturing a thin film transistor (TFT) using the photomask is also provided.

5 Claims, 8 Drawing Sheets

150
133A
132A
E1
D1
D1
$W_{D1}$
E1
131A
$W_{D1}$

METHOD FOR MANUFACTURING THIN FILM TRANSISTOR

BACKGROUND OF THE INVENTION

1. Field of the Invention

The present invention relates to a method for manufacturing a thin film transistor (TFT); and particularly to a method for manufacturing a TFT typically used in a liquid crystal display (LCD).

2. Related Art

Generally, a conventional bottom gate type TFT used in an LCD includes a substrate, a gate electrode formed on the substrate, a gate insulation layer formed on the gate electrode, an amorphous silicon (a-Si) layer formed on the gate insulation layer, two impurity-doped a-Si layers formed on two ends of the a-Si layer respectively, a source electrode formed on one of the impurity-doped a-Si layers and the gate insulation layer, and a drain electrode formed on the other impurity-doped a-Si layer and the gate insulation layer.

Referring to FIG. 4, a conventional method of manufacturing a bottom gate type TFT includes the steps of:

step 10 (as shown in FIG. 5): an insulating substrate 31 having a gate metal layer 32 and a first photo-resist layer 33 formed thereon is provided.

step 11 (as shown in FIG. 6): a gate electrode 42 is formed mainly by patterning the gate metal layer 32 using a first photolithographic process, which includes exposing and developing the first photo-resist layer 33 and etching the gate metal layer 32.

step 12 (as shown in FIG. 7): a gate insulation layer 51, an a-Si layer 52, an impurity-doped a-Si layer 53, a metal layer 54 (for the source and the drain electrodes) and a second photo-resist layer 55 are coated on the gate electrode 42 and the insulating substrate 31, in that order from bottom to top.

step 13 (as shown in FIG. 8): a photomask having three light shielding regions 61, 62, 63 and two slits between the light shielding regions 61, 62, 63 is provided.

step 14 (as shown in FIG. 9): a source and drain pattern is formed; in particular, the second photo-resist layer 55 is exposed and developed, and then a residual portion of the second photo-resist layer 55 is wiped off to form a photo-resist structure 65 and a recess 66; then the metal layer 54 is wet etched, wherein a portion of the metal layer 54 which is not covered by the photo-resist structure 65 is wiped off, thereby forming a source/drain electrode pattern 74, as shown in FIG. 10.

step 15 (as shown in FIG. 11): a channel layer 82 and an impurity-doped a-Si pattern 83 are formed; in particular, the a-Si layer 52 and the impurity-doped a-Si layer 53 are dry etched, wherein portions of the a-Si layer 52 and the impurity-doped a-Si layer 53 which are not covered by the source/drain electrode pattern 74 are wiped off, thereby forming the channel layer 82 and the impurity-doped a-Si pattern 83. Further, in the above-described dry etching, the photo-resist structure 65 is constantly corroded, thereby forming a through hole *66a* in a center of the photo-resist structure 65, as shown in FIG. 12.

step 16 (as shown in FIG. 13): the source electrode 84, the drain electrode 85, the source ohmic contact layer 832 and the drain ohmic contact layer 831 are formed; in particular, the source/drain electrode pattern 74 and the impurity-doped a-Si pattern 83 are etched, wherein portions of the source/drain electrode pattern 74 and the impurity-doped a-Si pattern 83 corresponding to the through hole 66a are wiped off. Consequently, a contact hole 86, the source and drain electrodes 84, 85, and the source and drain ohmic contact layers 832, 831 are formed.

step 17: a passivation layer is coated on top of the hitherto-formed structure.

step 18: a passivation pattern is obtained using a third photolithographic process, which includes exposing and developing a third photo-resist layer and etching the passivation layer.

step 19: an electrically conductive layer is coated on the hitherto-formed structure.

step 20: a pixel electrode is formed.

Referring to FIG. 14, a pixel unit of a conventional LCD is shown. The pixel unit has a thin film transistor. The thin film transistor has a source electrode 91 having a generally U-shaped structure, and a drain electrode 92. The drain electrode 92 and the source electrode 91 define a generally U-shaped gap 93 therebetween.

FIG. 15 is a schematic, top plan view of a channel portion of a second photomask 120 used in manufacturing an array of bottom gate type TFTs according to the above-described method. The photomask 120 has a first photomask pattern 91A corresponding to the source electrode 91, a second photomask pattern 92A corresponding to the drain electrode 92, and a third photomask pattern 93A corresponding to the U-shaped gap 93. The third photomask pattern 93A includes two slits each having a generally U-shaped configuration. Light beams transmit through the two slits and illuminate the second photo-resist layer 55 and thereby form the photo-resist structure 65 having the recess 66. The photo-resist structure 65 has a thin layer portion corresponding to the recess 66. However, a width $W_D$ of bending portions D of the third photomask pattern 93A generally is wider than a width $W_0$of other portions of the third photornask pattern 93A (except for certain end portions E). This means transmittance of light at the bending portions D is increased, and the second photo-resist layer 55 at these portions is liable to be over-exposed. If this happens, the bottom gate type TFT may be improperly formed and unworkable or unsatisfactory. That is, the yield rate of the array of bottom gate type TFTs formed in mass production may be unduly low.

It is desired to provide a method for manufacturing a TFT which overcomes the above-described problems.

SUMMARY

An exemplary photo-mask has a slit. The slit has at least one turning region and at least one other regions, and the slit at the at least one turning region has a narrower width than the slit at the at least one other regions.

An exemplary method for manufacturing a thin film transistor (TFT) is also provided. The TFT formed by the method has a source electrode, a drain electrode, and a groove between the source electrode and the drain electrode. The method comprises the following steps: providing an insulating substrate, and coating a gate metal layer in that order on the insulating substrate; forming a gate electrode from the gate metal layer; coating a gate insulation layer, an amorphous silicon (a-Si) layer, an impurity-doped a-Si layer and a source/drain electrode metal layer in that order on the gate electrode; providing a photomask having at least one slit; forming a source/drain electrode metal pattern; forming an a-Si layer pattern and an impurity-doped a-Si layer pattern; and forming a source electrode, a drain electrode and a groove. The at least one slit of the photo-mask has at least one turning region and at least one other region, and the at least one turning region has a narrower width than that of the at least one other region.

Other advantages and novel features will become more apparent from the following detailed description when taken in conjunction with the accompanying drawings; in which:

DETAILED DESCRIPTION OF THE EMBODIMENTS

Figure 1:
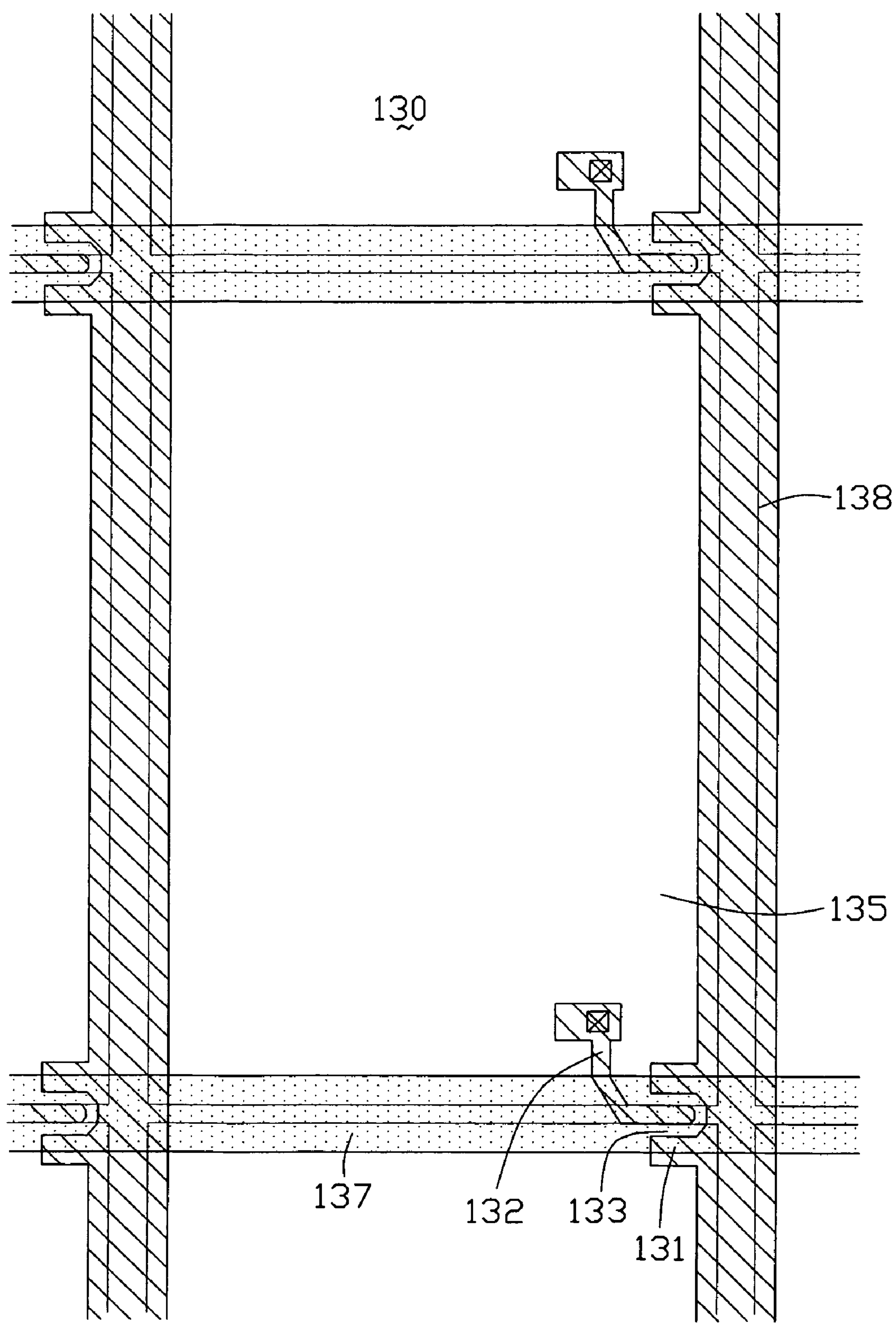
FIG. 1 is a schematic, top, cross-sectional view of part of a TFT substrate formed according to any of various embodiments of the present invention, showing one of a plurality of pixel units of the TFT substrate.

Referring to FIG. 1, this shows part of a thin film transistor substrate formed according to any of various embodiments of the present invention. In particular, one of a plurality of pixel units 130 of the thin film transistor substrate is shown. Each pixel unit 130 has two adjacent data lines 138 and two adjacent gate lines 137. The data lines 138 and the gate lines 137 cross each other, thereby defining the pixel unit 130. The pixel unit 130 has a thin film transistor (TFT), which is disposed adjacent to an intersection of one of the data lines 138 and one of the gate lines 137. Each TFT has a gate electrode (not labeled) electrically connecting to the corresponding gate line 137, a source electrode 131 electrically connecting to the corresponding data line 138, and a drain electrode 132 electrically connecting to a corresponding pixel electrode 135. The TFT receives signals from the gate line 137 and the data line 138 to control the electrical potential of the pixel electrode 135. Thus, the pixel electrode 135 and a corresponding common electrode (not shown) cooperatively form an electrical field to control twisting of liquid crystal molecules in a portion of a liquid crystal layer (not shown) adjacent the thin film transistor substrate that corresponds to the pixel unit 130. The source electrode 131 has a generally U-shaped structure, and a groove 133 defined between the drain electrode 132 and the source electrode 131 is generally U-shaped.

Figure 2:
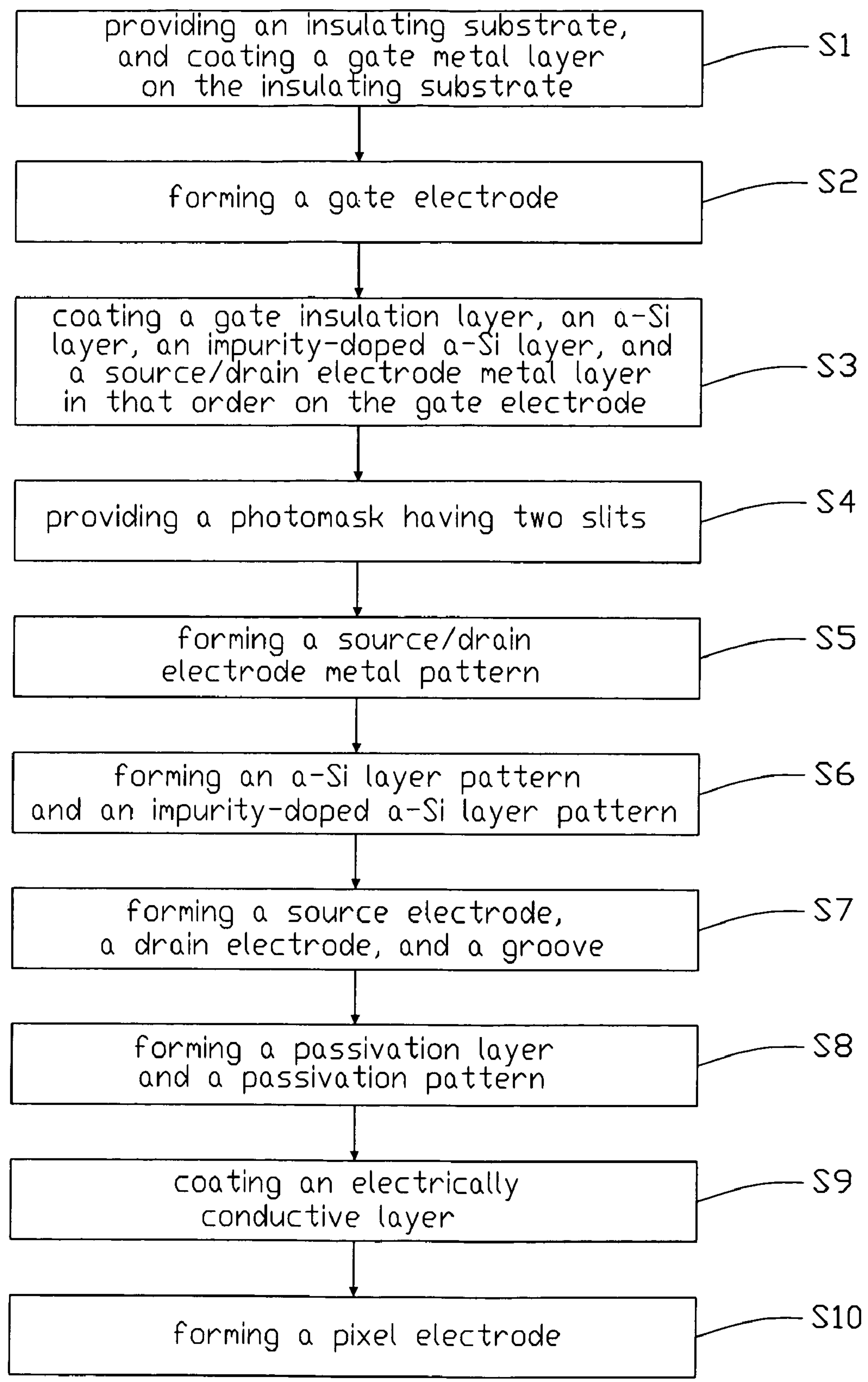
FIG. 2 is a flow chart of an exemplary method for manufacturing the TFT of FIG. 1, according to one embodiment of the present invention.

Referring to FIG. 2, an exemplary method for forming the above-described TFT is summarized. The method is similar to the above-described conventional method of manufacturing a bottom gate type TFT, and mainly includes the following steps:

step S1: providing an insulating substrate, and coating a gate metal layer on the insulating substrate;

step S2: forming a gate electrode from the gate metal layer;

step S3: coating a gate insulation layer, an a-Si layer, an impurity-doped a-Si layer, and a source/drain electrode metal layer in that order on the gate electrode;

step S4: providing a photomask having two slits;

step S5: forming a source/drain electrode metal pattern;

step S6: forming an a-Si layer pattern from the a-Si layer, and forming an impurity-doped a-Si layer pattern from the impurity-doped a-Si layer;

step S7: forming a source electrode, a drain electrode, and a groove;

step S8: forming a passivation layer on the hitherto-formed structure, and a passivation pattern from the passivation layer;

step S9: coating an electrically conductive layer on the passivation pattern; and step S10: forming a pixel electrode.

Figure 3:
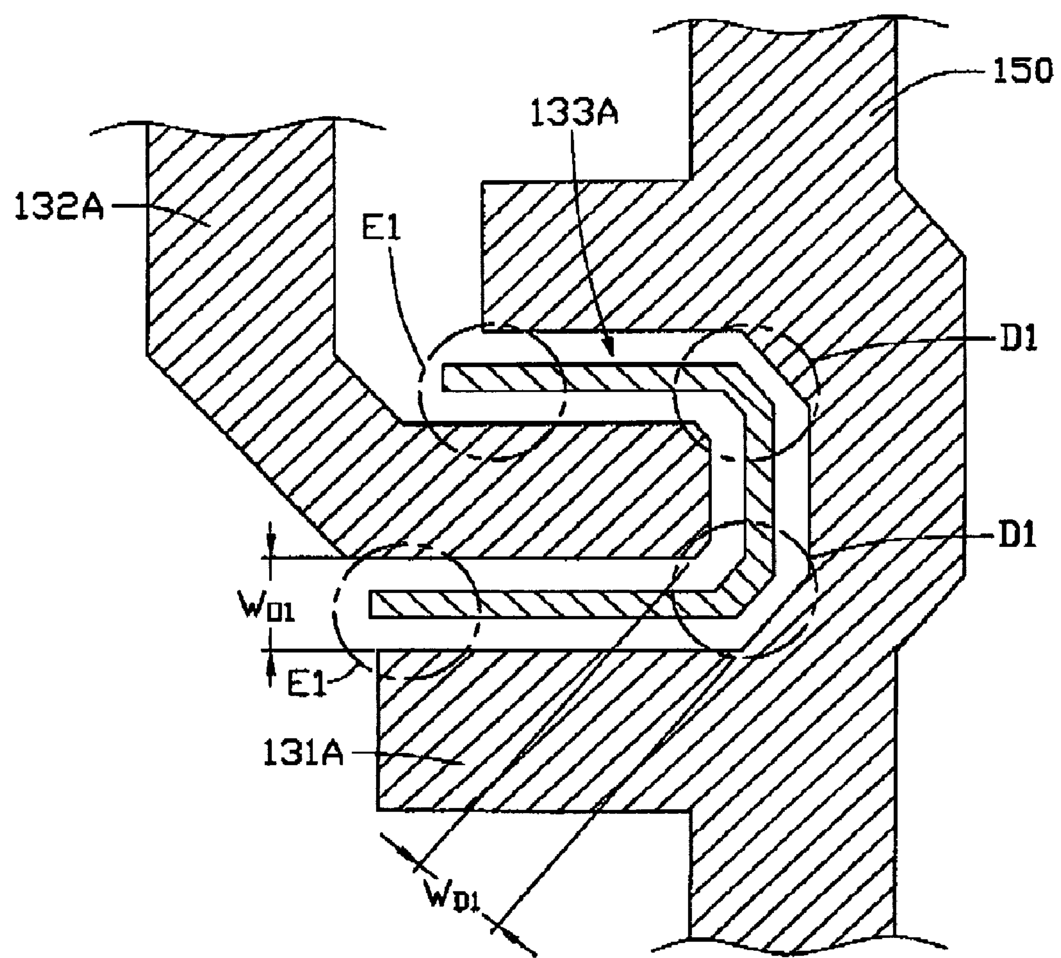
FIG. 3 is a schematic, top plan view of a part of an exemplary photomask used in the method of FIG. 2.
Figure 4:
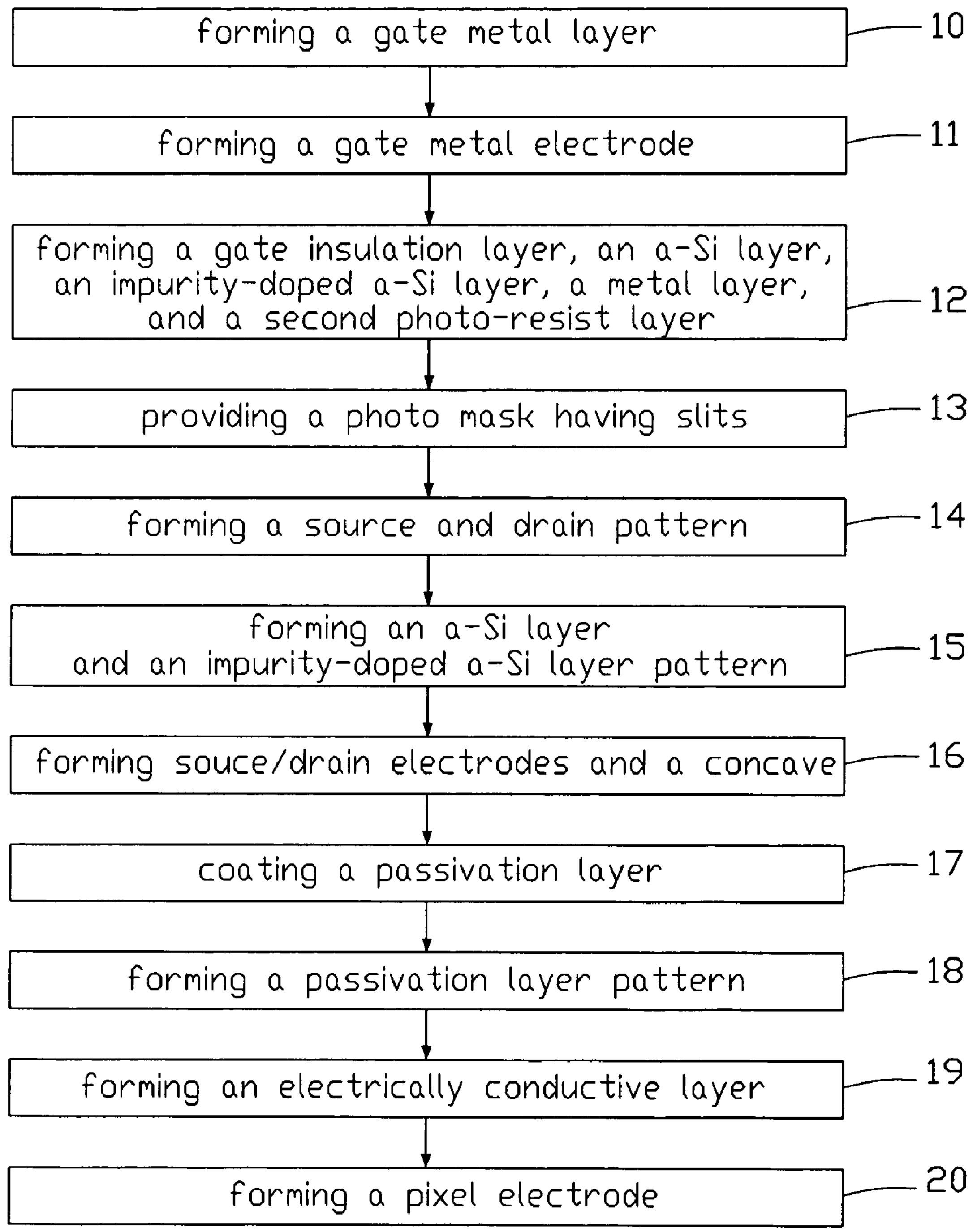
FIG. 4 is a flow chart of a conventional method of manufacturing a TFT.
Figure 5:
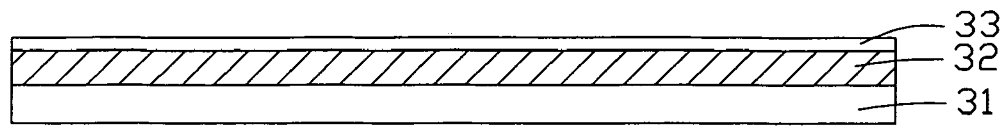
FIGS. 5 and 6 are cross-sectional views relating to successive stages in a first photolithographic process used in the method of FIG. 4.
Figure 6:
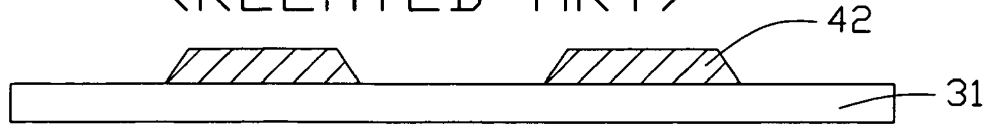
Figure 7:
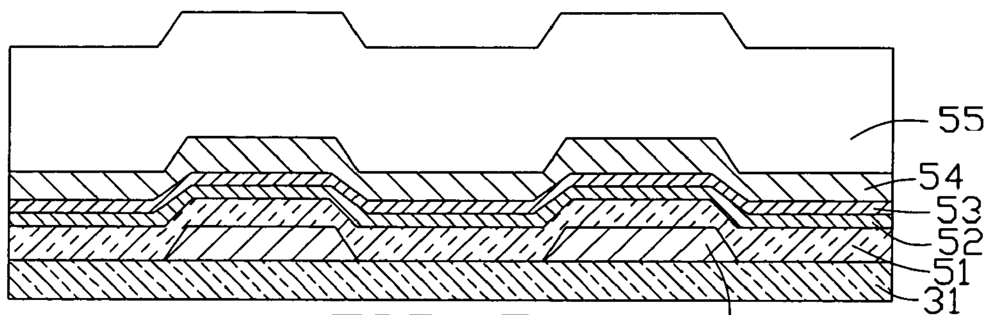
FIGS. 7 through 15 are cross-sectional views relating to successive stages in a second photolithographic process used in the method of FIG. 4.
Figure 8:
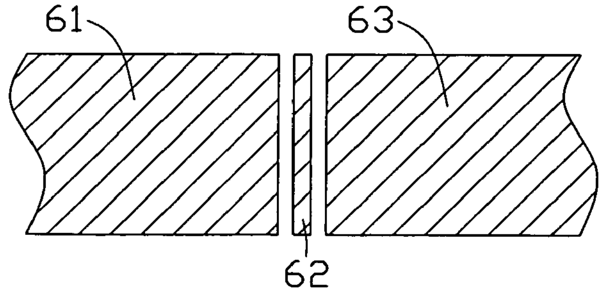
Figure 9:
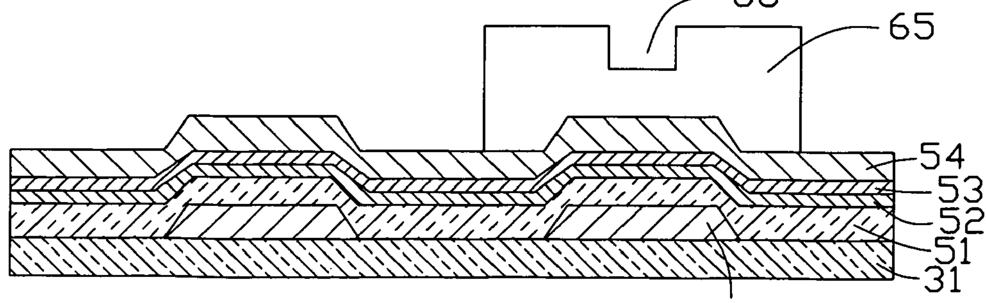
Figure 10:
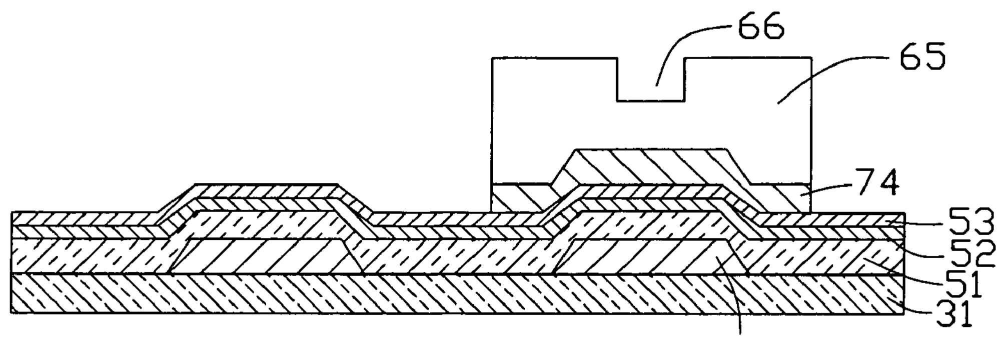
Figure 11:
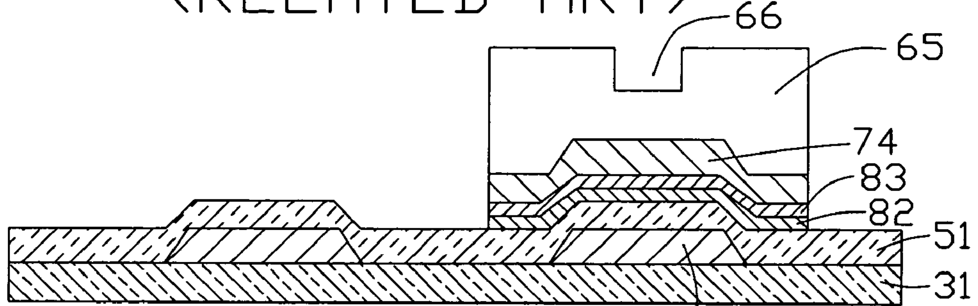
Figure 12:
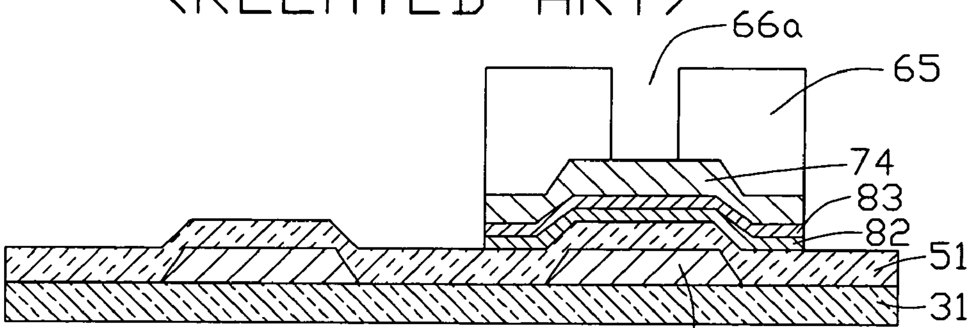
Figure 13:
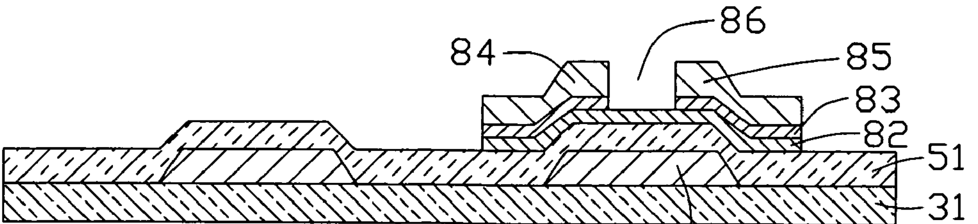
Figure 14:
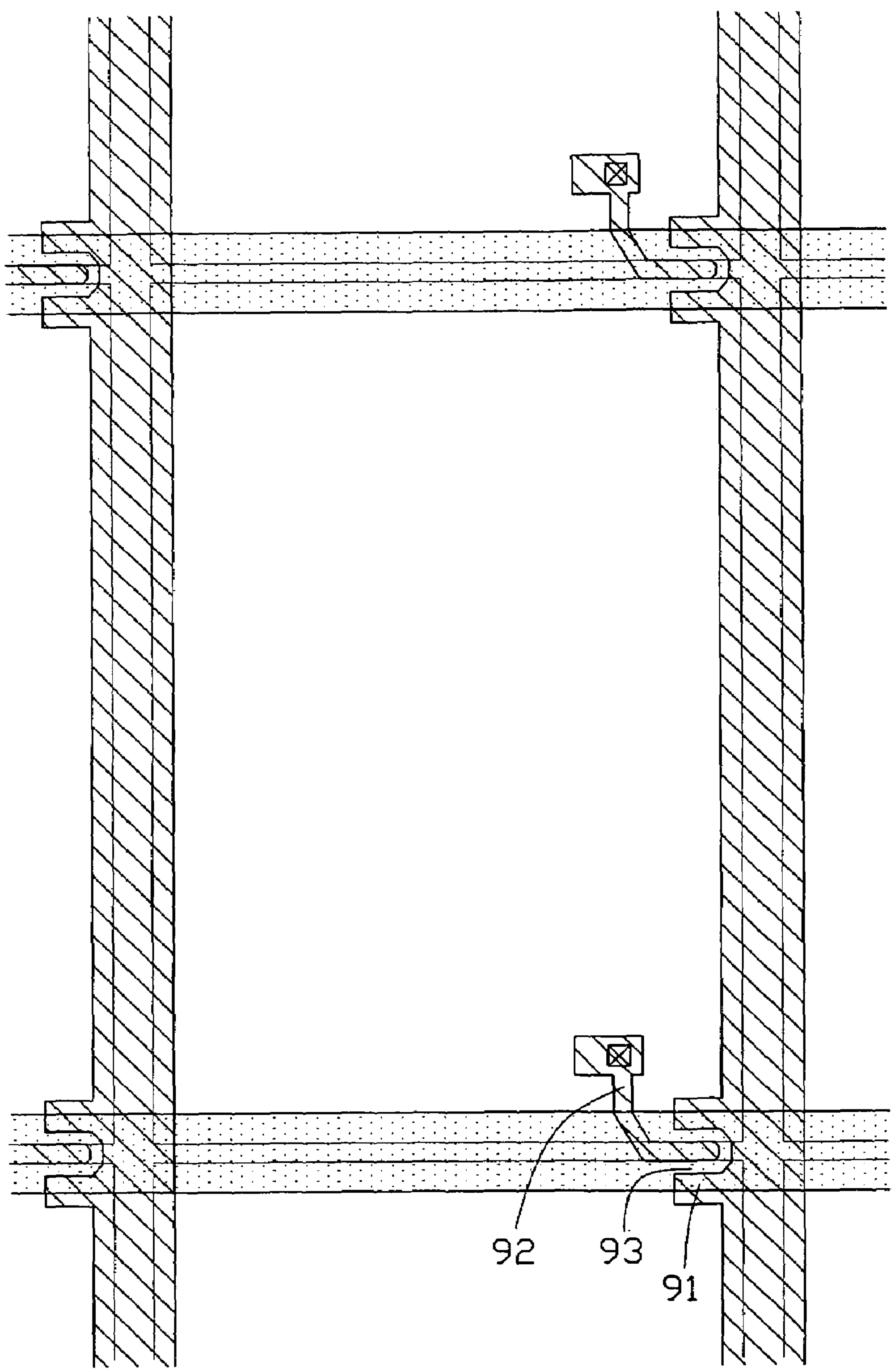
Figure 15:
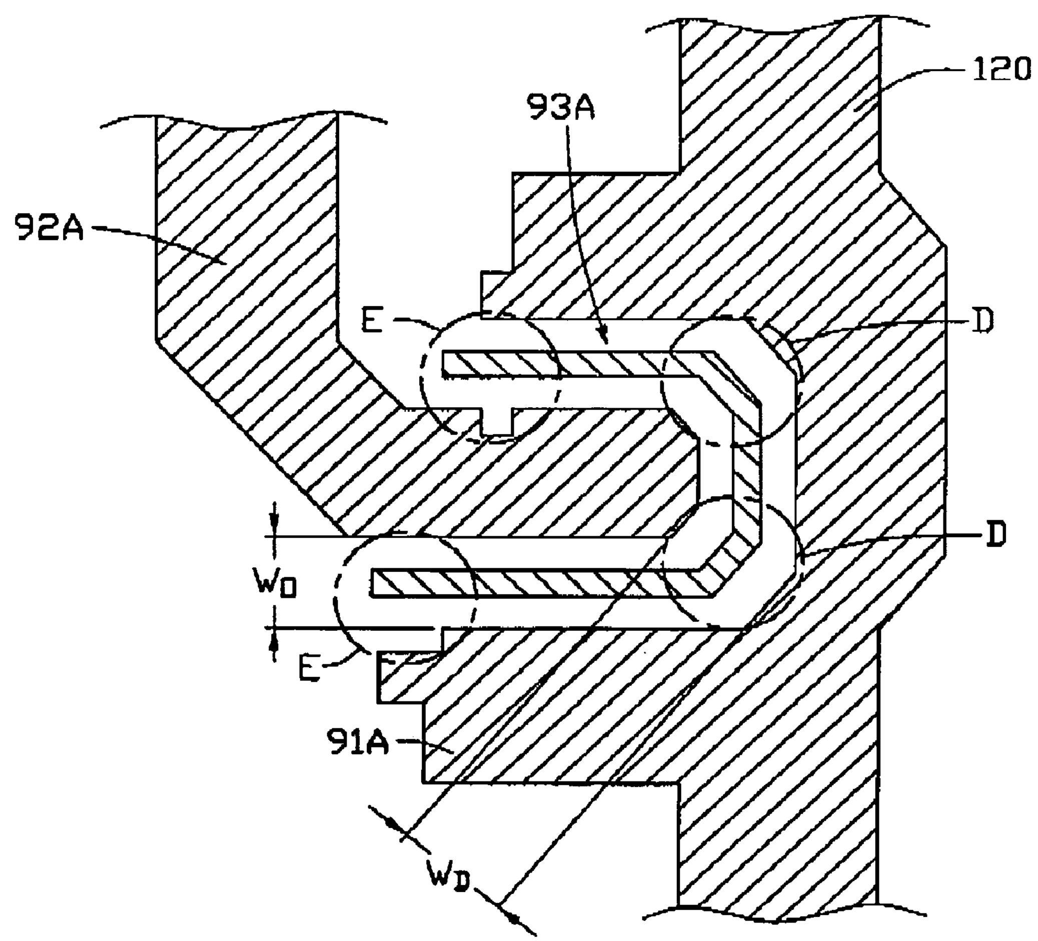

In the process of step S5, the source electrode, the drain electrode, and the groove are formed using a photomask 150 as partly shown in FIG. 3. The photomask 150 has a generally U-shape slit configuration, which includes a transmission region 133A corresponding to the groove 133 of the pixel unit 130, a first opaque region 131A corresponding to the source electrode 131 of the pixel unit 130, and a second opaque region 132A corresponding to the drain electrode 132 of the pixel unit 130. The transmission region 133A has a pair of turning regions D1, a pair of end regions E1, and other transmission regions (not labeled). Each turning region D1 has a narrower width $W_{D1}$ than a width of each end region E1, and a narrower width than $W_{D1}$ than a width $W_{O1}$ of the other transmission regions. In the illustrated embodiment, each turning region D1 has an angular configuration. In alternative embodiments, each turning region D1 can have an arcuate configuration or another kind of curved configuration.

When light beams are used for exposing the relevant photoresist layer through the turning regions D1 of the photomask 150, the intensity of exposure is lower than that of the above-described conventional method, because the turning regions D1 have a narrower width $W_{D1}$ compared to a Width $W_D$ of the bending portions D of the above-described conventional second photomask 120. Further, the width of the turning regions D1 can be determined according to the wavelength of the light beams used, whereby similar exposure intensities at all of the turning regions D1,the end regions E1, and the other transmission regions can be attained. That is,uniformity of exposure intensity throughout the relevant portion of the photoresist layer can be obtained. Therefore, the yield rate of arrays of the TFTs formed in mass production can be improved.

The above-described exemplary method for manufacturing the TFT can also be used and adapted to form a TFT with a groove having a plurality of turning structures provided thereat. That is, the above-described exemplary method is not limited to obtaining a TFT having a U-shaped groove. In addition, the above-described exemplary method is not limited to the manufacturing of a TFT; the method can also be used in manufacturing other semiconductor elements, components, apparatus, structures, etc.

It is to be further understood that even though numerous characteristics and advantages of the present embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. A method for manufacturing a thin film transistor (TFT), the TFT comprising a source electrode, a drain electrode, and a groove between the source electrode and the drain electrode, the method comprising:

providing an insulating substrate, and coating a gate metal layer on the insulating substrate;

forming a gate electrode from the gate metal layer;

coating a gate insulation layer, an amorphous silicon (a-Si) layer, an impurity-doped a-Si layer, and a source/drain electrode metal layer in that order on the gate electrode;

providing a photomask having at least one slit configuration;

forming a source/drain electrode metal pattern;

forming an a-Si layer pattern and an impurity-doped a-Si layer pattern; and forming a source electrode; a drain electrode, and a groove;

wherein the at least one slit configuration of the photomask has a transmission region corresponding to the groove, and at least two opaque regions respectively corresponding to the source electrode and the drain electrode, the transmission region having at least one turning region and at least one other region, and the at least one turning region has a narrower width than that of the at least one other region.

2. The method as claimed in claim 1, further comprising forming a passivation layer on the source electrode, the drain electrode and the groove.

3. The method as claimed in claim 1, wherein the at least one slit has a generally U-shaped configuration.

4. The method as claimed in claim 1, wherein the at least one slit defines a plurality of turning regions.

5. The method as claimed in claim 4, wherein the at least one turning region has an angular configuration or a curved configuration.

* * * * *